(12) United States Patent
Hjerrild et al.

(10) Patent No.: US 12,231,075 B2
(45) Date of Patent: *Feb. 18, 2025

(54) BUILDING INTEGRATED PHOTOVOLTAIC SYSTEMS

(71) Applicant: GAF Energy LLC, Parsippany, NJ (US)

(72) Inventors: Natasha Hjerrild, Parsippany, NJ (US); David Kavulak, San Francisco, CA (US); Richard Perkins, San Jose, CA (US); Gabriela Bunea, San Jose, CA (US); William Holt, Parsippany, NJ (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/494,429

(22) Filed: Oct. 25, 2023

(65) Prior Publication Data
US 2024/0146234 A1    May 2, 2024

Related U.S. Application Data

(60) Provisional application No. 63/419,972, filed on Oct. 27, 2022.

(51) Int. Cl.
*H02S 20/23* (2014.01)
*H01L 31/049* (2014.01)

(52) U.S. Cl.
CPC .......... *H02S 20/23* (2014.12); *H01L 31/049* (2014.12)

(58) Field of Classification Search
CPC ............................................. H02S 20/22–26
See application file for complete search history.

(56) References Cited

U.S. PATENT DOCUMENTS

| 1,981,467 A | 11/1934 | Radtke |
| 3,156,497 A | 11/1964 | Lessard |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Products: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Daniel P Malley, Jr.
(74) *Attorney, Agent, or Firm* — GREENBERG TRAURIG, LLP

(57) ABSTRACT

A system includes first, second and third photovoltaic modules on a rood. Each module includes an upper edge, a lower edge and at least one solar cell. Lower edges of the cells of the first and second modules are offset from lower edges of the first and second modules. Upper edge of the cell of the second module is offset from the upper edge of the second module. The upper edge of the cell of the third module is offset from the upper edge of the third module. The first module overlays the second module. The lower edge of the cell of the first module is substantially aligned with the upper edge of the cell of the second module. The second module overlays the third module. The lower edge of the cell of the second module is substantially aligned with the upper edge of the cell of the third module.

18 Claims, 6 Drawing Sheets

(56) References Cited

U.S. PATENT DOCUMENTS

| | | |
|---|---|---|
| 3,581,779 A | 6/1971 | Gilbert, Jr. |
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,201,180 B1 | 3/2001 | Meyer et al. |
| 6,220,329 B1 | 4/2001 | King et al. |
| 6,308,482 B1 | 10/2001 | Strait |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,776,455 B2 | 7/2014 | Azoulay |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,153,950 B2 | 10/2015 | Yamanaka et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,579,028 B1 | 3/2020 | Jacob |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,309,828 B2 | 4/2022 | Sirski et al. |
| 11,394,344 B2 | 7/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 11,444,569 B2 | 9/2022 | Clemente et al. |
| 11,454,027 B2 | 9/2022 | Kuiper et al. |
| 11,459,757 B2 | 10/2022 | Nguyen et al. |
| 11,486,144 B2 | 11/2022 | Bunea et al. |
| 11,489,482 B2 | 11/2022 | Peterson et al. |
| 11,496,088 B2 | 11/2022 | Sirski et al. |
| 11,508,861 B1 | 11/2022 | Perkins et al. |
| 11,512,480 B1 | 11/2022 | Achor et al. |
| 11,527,665 B2 * | 12/2022 | Boitnott ............... H02S 40/34 |
| 11,545,927 B2 | 1/2023 | Abra et al. |
| 11,545,928 B2 | 1/2023 | Perkins et al. |
| 11,658,470 B2 | 5/2023 | Nguyen et al. |
| 11,661,745 B2 | 5/2023 | Bunea et al. |
| 11,689,149 B2 | 6/2023 | Clemente et al. |
| 11,705,531 B2 | 7/2023 | Sharenko et al. |
| 11,728,759 B2 | 8/2023 | Nguyen et al. |
| 11,732,490 B2 | 8/2023 | Achor et al. |
| 11,811,361 B1 | 11/2023 | Farhangi et al. |
| 11,824,486 B2 | 11/2023 | Nguyen et al. |
| 11,824,487 B2 | 11/2023 | Nguyen et al. |
| 11,843,067 B2 | 12/2023 | Nguyen et al. |

(56) References Cited

U.S. PATENT DOCUMENTS

| | | |
|---|---|---|
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2004/0000334 A1 | 1/2004 | Ressler |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2005/0193673 A1 | 9/2005 | Rodrigues et al. |
| 2006/0042683 A1 | 3/2006 | Gangemi |
| 2006/0046084 A1 | 3/2006 | Yang et al. |
| 2007/0074757 A1 | 4/2007 | Mellott et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014057 A1 | 1/2009 | Croft et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1* | 2/2011 | Kalkanoglu ............ H02S 20/23 29/897.3 |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2011/0314753 A1 | 12/2011 | Farmer et al. |
| 2012/0034799 A1 | 2/2012 | Hunt |
| 2012/0060434 A1 | 3/2012 | Jacobs |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0282437 A1 | 11/2012 | Clark et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0125482 A1* | 5/2013 | Kalkanoglu ............ F24S 25/61 52/173.3 |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0208675 A1 | 7/2014 | Beerer et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0294765 A1 | 10/2018 | Friedrich et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1* | 10/2020 | Hem-Jensen ......... H01L 31/054 |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0301536 A1 | 9/2021 | Baggs et al. |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CN | 202797032 U | 3/2013 |
| CN | 217150978 U | 8/2022 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-1348283 B1 | 1/2014 |

(56) References Cited

FOREIGN PATENT DOCUMENTS

| KR | 10-2019-0000367 A | 1/2019 |
|---|---|---|
| KR | 10-2253483 B1 | 5/2021 |
| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | 2021-247098 A1 | 12/2021 |
| WO | 2022/051593 A1 | 3/2022 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

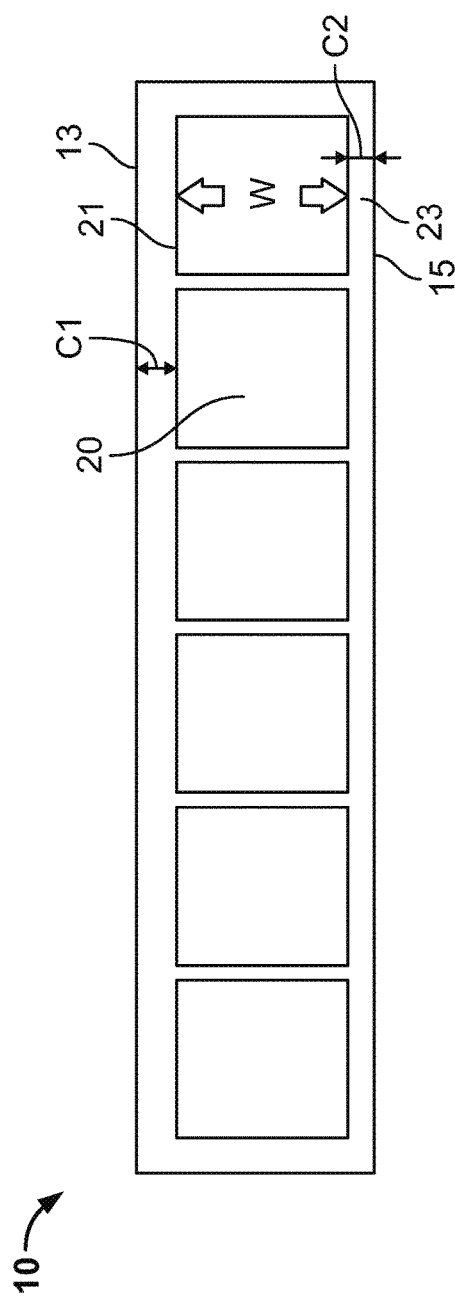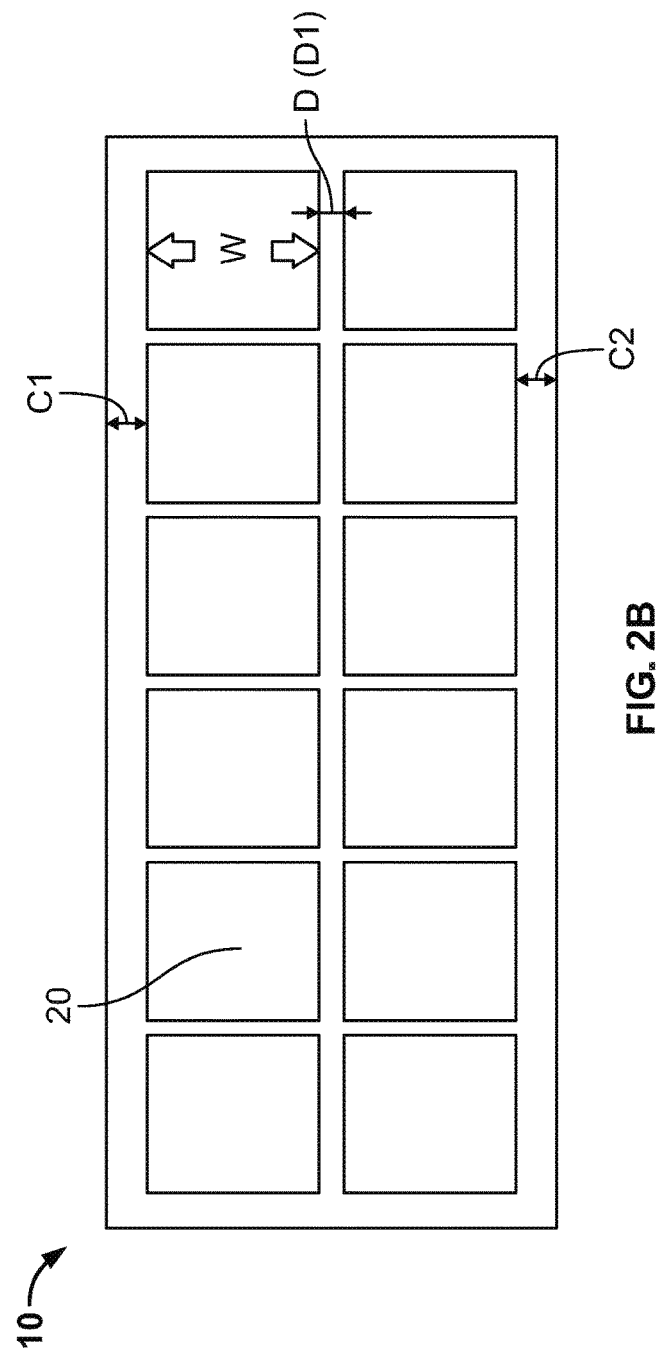

BUILDING INTEGRATED PHOTOVOLTAIC SYSTEMS

CROSS-REFERENCE TO RELATED APPLICATION

This application is a Section 111(a) application relating to and claiming the benefit of commonly owned, U.S. Provisional Patent Application Ser. No. 63/419,972, filed Oct. 27, 2022, entitled "BUILDING INTEGRATED PHOTOVOLTAIC SYSTEMS," the contents of which is incorporated herein by reference in its entirety.

FIELD OF THE INVENTION

The present invention relates to photovoltaic systems and, more particularly, building integrated photovoltaic systems.

BACKGROUND

Photovoltaic systems are installed on building roofs to generate electricity.

SUMMARY

In some embodiments, a system includes at least first, second and third photovoltaic modules installed on a steep slope roof deck, wherein each of the at least first, second and third photovoltaic modules includes an upper edge and a lower edge opposite the upper edge, and at least one solar cell wherein the at least one solar cell includes an upper edge, a lower edge opposite the upper edge of the at least one solar cell, and a width extending from the upper edge of the at least one solar cell to the lower edge of the at least one solar cell, wherein the lower edge of the at least one solar cell of the first photovoltaic module is offset from the lower edge of the first photovoltaic module by a first distance, wherein the lower edge of the at least one solar cell of the second photovoltaic module is offset from the lower edge of the second photovoltaic module by a first distance, wherein the upper edge of the at least one solar cell of the second photovoltaic module is offset from the upper edge of the second photovoltaic module by a second distance, wherein the upper edge of the at least one solar cell of the third photovoltaic module is offset from the upper edge of the third photovoltaic module by a second distance; and wherein the first photovoltaic module overlays at least a portion of the second photovoltaic module, wherein the lower edge of the at least one solar cell of the first photovoltaic module is substantially aligned with the upper edge of a corresponding one of the at least one solar cell of the second photovoltaic module, wherein the second photovoltaic module overlays at least a portion of the third photovoltaic module, and wherein the lower edge of the at least one solar cell of the second photovoltaic module is substantially aligned with a corresponding one of the upper edge of the at least one solar cell of the third photovoltaic module.

In some embodiments, the lower edge of the at least one solar cell of the third photovoltaic module is offset from the lower edge of the third photovoltaic module by a first distance, and wherein the upper edge of the at least one solar cell of the first photovoltaic module is offset from the upper edge of the first photovoltaic module by a second distance. In some embodiments, each of the at least first, second and third photovoltaic modules includes a fractional inactive area, wherein the fractional inactive area is calculated as the first distance divided by a sum of the first distance and the width. In some embodiments, the first distance is 0.1 mm to 25 mm. In some embodiments, the width is 150 mm to 250 mm. In some embodiments, the fractional inactive area is 0.05 to 0.1.

In some embodiments, the at least one solar cell includes a plurality of solar cells, and wherein the plurality of solar cells is arranged in at least one row. In some embodiments, the at least one row includes a single row. In some embodiments, the second distance is 0.1 mm to 25 mm. In some embodiments, the at least one solar cell includes a plurality of solar cells, wherein the plurality of solar cells is arranged in a plurality of rows, wherein the lower edge of each of the plurality of solar cells in a lower most row of the plurality of rows of the first photovoltaic module is substantially aligned with the upper edge of a corresponding one of the plurality of solar cells in an upper most row of the plurality of rows of the second photovoltaic module, and wherein the lower edge of each of the plurality of solar cells in a lower most row of the plurality of rows of the second photovoltaic module is substantially aligned with the upper edge of a corresponding one of the plurality of solar cells in an upper most row of the plurality of rows of the third photovoltaic module.

In some embodiments, each of the at least first, second and third photovoltaic modules includes an encapsulant encapsulating the at least one solar cell, wherein the encapsulant includes a first end, a second end opposite the first end, a first surface extending from the first end to the second end, and a second surface opposite the first surface and extending from the first end to the second end, wherein the encapsulant is transparent. In some embodiments, each of the at least first, second and third photovoltaic modules includes a frontsheet juxtaposed with the first surface of the encapsulant, wherein the frontsheet includes a first end and a second end opposite the first end of the frontsheet, and wherein the frontsheet is transparent.

In some embodiments, each of the at least first, second and third photovoltaic modules includes a backsheet juxtaposed with the second surface of the encapsulant, wherein the backsheet includes a first section, and a second section juxtaposed with the first section, wherein the first section is transparent, wherein the second section is non-transparent, wherein the first end of the frontsheet, the first end of the encapsulant, and the first section of the backsheet form a transparent portion, wherein the transparent portion of the first photovoltaic module overlays at least a portion of the at least one solar cell of the second photovoltaic module, and wherein the transparent portion of the second photovoltaic module overlays at least a portion of the at least one solar cell of the third photovoltaic module.

In some embodiments, the first section extends from the first edge of the corresponding one of the at least first, second and third photovoltaic modules to a first location intermediate the first edge of the corresponding one of the at least first, second and third photovoltaic modules and the second edge of the corresponding one of the at least first, second and third photovoltaic modules, and wherein the second section extends from the first location to the second edge of the corresponding one of the at least first, second and third photovoltaic modules. In some embodiments, the backsheet includes a first surface, a second surface opposite the first surface of the backsheet, a first side extending from the first edge of the corresponding one of the at least first, second and third photovoltaic modules to the second edge the corresponding one of the at least first, second and third photovoltaic modules, and a second side opposite the first side and extending from the first edge of the corresponding one of the at least first, second and third photovoltaic modules to the second edge of the corresponding one of the at least first, second and third photovoltaic modules, wherein the first section extends from the first side to the second side and from the first surface of the backsheet to the second surface of the backsheet. In some embodiments, the second section extends from the first side to the second side and from the first surface of the backsheet to the second surface of the backsheet. In some embodiments, each of the at least first, second and third photovoltaic modules includes an adhesive juxtaposed with the first section of the backsheet, wherein the adhesive is transparent, wherein the adhesive optically couples the first photovoltaic module with the second photovoltaic module, and wherein the adhesive optically couples the second photovoltaic module with the first photovoltaic module.

In some embodiments, each of the at least first, second and third photovoltaic modules includes a backsheet juxtaposed with the second surface of the encapsulant, wherein the backsheet includes a first section, wherein the first section includes a beveled portion, and wherein the beveled portion of the first photovoltaic module overlays at least a portion of the at least one solar cell of the second photovoltaic module, and wherein the beveled portion of the second photovoltaic module overlays at least a portion of the at least one solar cell of the third photovoltaic module. In some embodiments, the beveled portion includes a reflective portion.

In some embodiments, a method includes the steps of obtaining at least first, second and third photovoltaic modules, wherein each of the at least first, second and third photovoltaic modules includes an upper edge and a lower edge opposite the upper edge, and at least one solar cell, wherein the at least one solar cell includes an upper edge and a lower edge opposite the upper edge, wherein the lower edge of the at least one solar cell is offset from the lower edge of a corresponding one of the at least first, second and third photovoltaic modules by a first distance, wherein the upper edge of the at least one solar cell is offset from the upper edge of the corresponding one of the at least first, second and third photovoltaic modules by a second distance, and installing the first photovoltaic module on a steep slope roof deck; installing the second photovoltaic module on the roof deck, wherein the second photovoltaic module overlays at least a portion of the first photovoltaic module, wherein the lower edge of the at least one solar cell of the second photovoltaic module is substantially aligned with the upper edge of the at least one solar cell of the first photovoltaic module; and installing the third photovoltaic module on the roof deck, wherein the third photovoltaic module overlays at least a portion of the second photovoltaic module, wherein the lower edge of the at least one solar cell of the third photovoltaic module is substantially aligned with the upper edge of the at least one solar cell of the second photovoltaic module.

BRIEF DESCRIPTION OF THE DRAWINGS

FIGS. 2A and 2B are top plan views of some embodiments of a photovoltaic module;

DETAILED DESCRIPTION

Figure 1A:
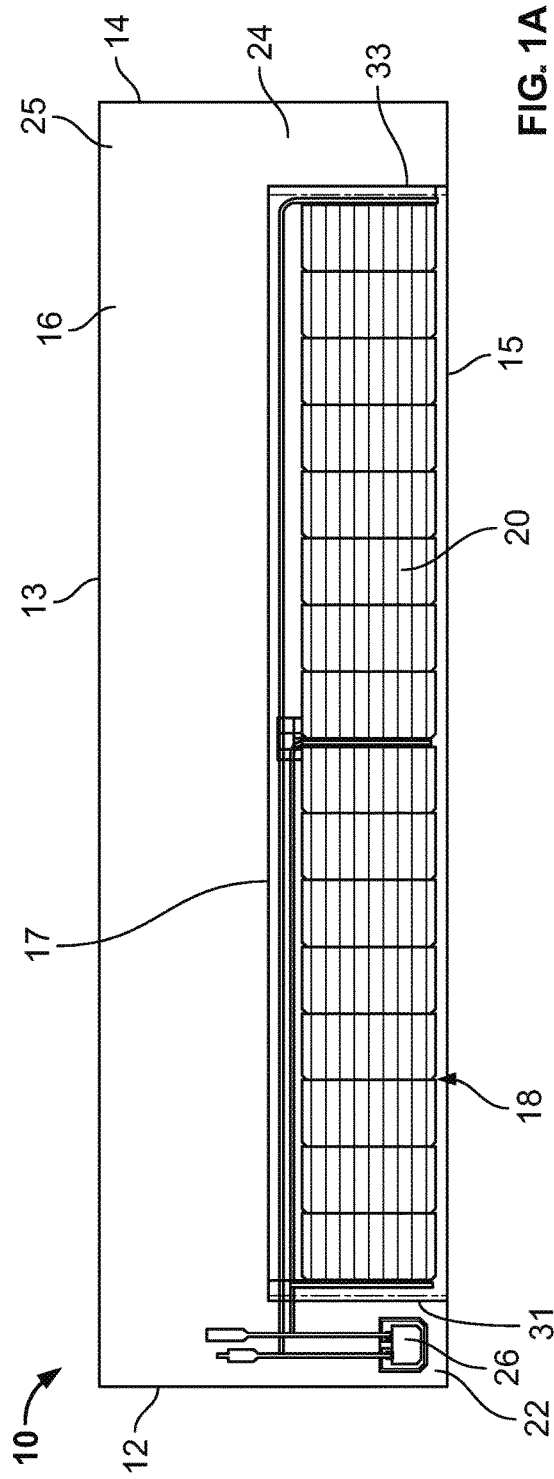
FIGS. 1A and 1B are a top plan view and side elevational view, respectively, of some embodiments of a photovoltaic module.
Figure 1B:
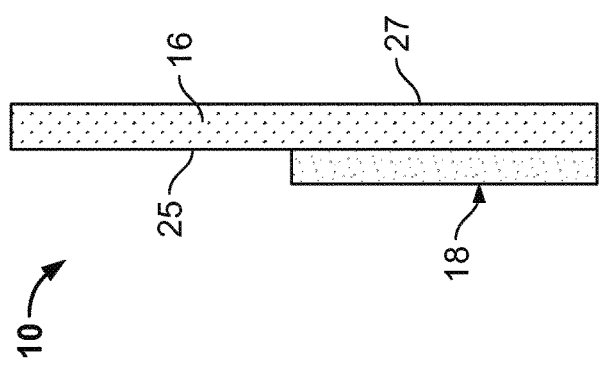

Referring to FIGS. 1A and 1B, in some embodiments, a photovoltaic module 10 includes a first end 12, a second end 14 opposite the first end 12, a upper edge 13 extending from the first end 12 to the second end 14, and a lower edge 15 opposite the upper edge 13 and extending from the first end 12 to the second end 14. In some embodiments, the photovoltaic module 10 includes a headlap portion 16. In some embodiments, the headlap portion 16 extends from the first end 12 to the second end 14 and from the upper edge 13 to a first location 17 between the upper edge 13 and the lower edge 15. In some embodiments, the photovoltaic module 10 does not include a headlap portion 16. In some embodiments, the photovoltaic module 10 includes a reveal portion 18. In some embodiments, the reveal portion 18 includes at least one solar cell 20.

In some embodiments, the photovoltaic module 10 includes a first side lap 22 located at the first end 12. In some embodiments, the first side lap 22 includes a length extending from the first end 12 to a second location 31 between the first end 12 and the second end 14. In some embodiments, the photovoltaic module 10 includes a second side lap 24 located at the second end 14. In some embodiments, the second side lap 24 includes a length extending from the second end 14 to a third location 33 between the first end 12 and the second end 14. In some embodiments, the photovoltaic module 10 includes an outer surface 25 and an inner surface 27 opposite the outer surface 25. In some embodiments, the reveal portion 18 extends from the first side lap 22 to the second side lap 24 and from the lower edge 15 to the first location 17. In some embodiments, the photovoltaic module 10 is configured to be installed on a building structure. In some embodiments, the photovoltaic module 10 is configured to be installed on an exterior wall of a building structure as described in further detail below. In some embodiments, at least one junction box 26 is located on the first side lap 22. In some embodiments, the at least one junction box 26 includes a plurality of the junction boxes 26. In some embodiments, the photovoltaic module 10 includes a structure, composition, components, and/or function similar to those of one or more embodiments of the photovoltaic modules disclosed in PCT International Patent Publication No. WO 2022/051593, Application No. PCT/US2021/049017, published Mar. 10, 2022, entitled Building Integrated Photovoltaic System, owned by GAF Energy LLC, the contents of which are incorporated by reference herein in its entirety.

Referring to FIGS. 2A and 2B, in some embodiments, each of the at least one solar cell 20 includes an upper edge 21 and a lower edge 23 opposite the upper edge 21. In some embodiments, the solar cell 20 includes a width W extending from the upper edge 21 to the lower edge 23. In some embodiments, the upper edge 21 of the solar cell 20 is offset from the upper edge 13 of the photovoltaic module 10 by a first clearance distance C1. In some embodiments, the lower edge 23 of the solar cell 20 is offset from the lower edge 15 of the photovoltaic module 10 by a second clearance distance C2.

In some embodiments, the first clearance distance C1 is 0.1 mm to 25 mm. In some embodiments, the first clearance distance C1 is 5 mm to 25 mm. In some embodiments, the first clearance distance C1 is 10 mm to 25 mm. In some embodiments, the first clearance distance C1 is 15 mm to 25 mm. In some embodiments, the first clearance distance C1 is 20 mm to 25 mm. In some embodiments, the first clearance distance C1 is 0.1 mm to 20 mm. In some embodiments, the first clearance distance C1 is 5 mm to 20 mm. In some embodiments, the first clearance distance C1 is 10 mm to 20 mm. In some embodiments, the first clearance distance C1 is 15 mm to 20 mm. In some embodiments, the first clearance distance C1 is 0.1 mm to 15 mm. In some embodiments, the first clearance distance C1 is 5 mm to 15 mm. In some embodiments, the first clearance distance C1 is 10 mm to 15 mm. In some embodiments, the first clearance distance C1 is 0.1 mm to 10 mm. In some embodiments, the first clearance distance C1 is 5 mm to 10 mm. In some embodiments, the first clearance distance C1 is 0.1 mm to 5 mm. In some embodiments, the first clearance distance C1 is 0.1 mm. In some embodiments, the first clearance distance C1 is 5 mm. In some embodiments, the first clearance distance C1 is 10 mm. In some embodiments, the first clearance distance C1 is 15 mm. In some embodiments, the first clearance distance C1 is 20 mm. In some embodiments, the first clearance distance C1 is 25 mm.

In some embodiments, the second clearance distance C2 is 0.1 mm to 25 mm. In some embodiments, the second clearance distance C2 is 5 mm to 25 mm. In some embodiments, the second clearance distance C2 is 10 mm to 25 mm. In some embodiments, the second clearance distance C2 is 15 mm to 25 mm. In some embodiments, the second clearance distance C2 is 20 mm to 25 mm. In some embodiments, the second clearance distance C2 is 0.1 mm to 20 mm. In some embodiments, the second clearance distance C2 is 5 mm to 20 mm. In some embodiments, the second clearance distance C2 is 10 mm to 20 mm. In some embodiments, the second clearance distance C2 is 15 mm to 20 mm. In some embodiments, the second clearance distance C2 is 0.1 mm to 15 mm. In some embodiments, the second clearance distance C2 is 5 mm to 15 mm. In some embodiments, the second clearance distance C2 is 10 mm to 15 mm. In some embodiments, the second clearance distance C2 is 0.1 mm to 10 mm. In some embodiments, the second clearance distance C2 is 5 mm to 10 mm. In some embodiments, the second clearance distance C2 is 0.1 mm to 5 mm. In some embodiments, the second clearance distance C2 is 0.1 mm. In some embodiments, the second clearance distance C2 is 5 mm. In some embodiments, the second clearance distance C2 is 10 mm. In some embodiments, the second clearance distance C2 is 15 mm. In some embodiments, the second clearance distance C2 is 20 mm. In some embodiments, the second clearance distance C1 is 25 mm.

In some embodiments, the width W is 150 mm to 250 mm. In some embodiments, the width W is 175 mm to 250 mm. In some embodiments, the width W is 200 mm to 250 mm. In some embodiments, the width W is 210 mm to 250 mm. In some embodiments, the width W is 225 mm to 250 mm. In some embodiments, the width W is 150 mm to 225 mm. In some embodiments, the width W is 175 mm to 225 mm. In some embodiments, the width W is 200 mm to 225 mm. In some embodiments, the width W is 210 mm to 225 mm. In some embodiments, the width W is 150 mm to 210 mm. In some embodiments, the width W is 175 mm to 210 mm. In some embodiments, the width W is 200 mm to 210 mm. In some embodiments, the width W is 150 mm to 200 mm. In some embodiments, the width W is 175 mm to 200 mm. In some embodiments, the width W is 150 mm to 175 mm. In some embodiments, the width W is 150 mm. In some embodiments, the width W is 175 mm. In some embodiments, the width W is 200 mm. In some embodiments, the width W is 210 mm. In some embodiments, the width W is 225 mm. In some embodiments, the width W is 250 mm.

In some embodiments, each of the photovoltaic modules 10 includes a fractional inactive area. In some embodiments, the fractional inactive area is calculated as the first clearance distance C1 divided by a sum of the first clearance distance C1 and the width W. In some embodiments, the fractional inactive area is calculated with the foregoing equation when at least two of the photovoltaic modules 10 overlap with one another, as described in further detail below. In some embodiments, the fractional inactive area is 0.05 to 0.1. In some embodiments, the fractional inactive area is 0.05 to 0.09. In some embodiments, the fractional inactive area is 0.05 to 0.08. In some embodiments, the fractional inactive area is 0.05 to 0.07. In some embodiments, the fractional inactive area is 0.05 to 0.06. In some embodiments, the fractional inactive area is 0.06 to 0.1. In some embodiments, the fractional inactive area is 0.06 to 0.09. In some embodiments, the fractional inactive area is 0.06 to 0.08. In some embodiments, the fractional inactive area is 0.06 to 0.07. In some embodiments, the fractional inactive area is 0.07 to 0.1. In some embodiments, the fractional inactive area is 0.07 to 0.09. In some embodiments, the fractional inactive area is 0.07 to 0.08. In some embodiments, the fractional inactive area is 0.08 to 0.1. In some embodiments, the fractional inactive area is 0.08 to 0.09. In some embodiments, the fractional inactive area is 0.09 to 0.1. In some embodiments, the fractional inactive area is 0.05. In some embodiments, the fractional inactive area is 0.06. In some embodiments, the fractional inactive area is 0.07. In some embodiments, the fractional inactive area is 0.08. In some embodiments, the fractional inactive area is 0.09. In some embodiments, the fractional inactive area is 0.1.

In some embodiments, the at least one solar cell 20 includes a plurality of the solar cells 20. In some embodiments, the plurality of solar cells 20 includes two solar cells. In some embodiments, the plurality of solar cells 20 includes three solar cells. In some embodiments, the plurality of solar cells 20 includes four solar cells. In some embodiments, the plurality of solar cells 20 includes five solar cells. In some embodiments, the plurality of solar cells 20 includes six solar cells. In some embodiments, the plurality of solar cells 20 includes seven solar cells. In some embodiments, the plurality of solar cells 20 includes eight solar cells. In some embodiments, the plurality of solar cells 20 includes nine solar cells. In some embodiments, the plurality of solar cells 20 includes ten solar cells. In some embodiments, the plurality of solar cells 20 includes eleven solar cells. In some embodiments, the plurality of solar cells 20 includes twelve solar cells. In some embodiments, the plurality of solar cells 20 includes thirteen solar cells. In some embodiments, the plurality of solar cells 20 includes fourteen solar cells. In some embodiments, the plurality of solar cells 20 includes fifteen solar cells. In some embodiments, the plurality of solar cells 20 includes sixteen solar cells. In some embodiments, the plurality of solar cells 20 includes more than sixteen solar cells.

In some embodiments, the plurality of solar cells 20 is arranged in one row (i.e., one reveal). In some embodiments, the fractional inactive area is calculated with the foregoing equation, namely, the first clearance distance C1 divided by a sum of the first clearance distance C1 and the width W when the plurality of solar cells 20 is arranged in one row (i.e., one reveal). See FIG. 2A.

In some embodiments, the plurality of solar cells 20 is arranged in two rows (i.e., two reveals). See FIG. 2B. In some embodiments, the plurality of solar cells 20 is arranged in three rows (i.e., three reveals). In some embodiments, the plurality of solar cells 20 is arranged in four rows (i.e., four reveals). In some embodiments, the plurality of solar cells 20 is arranged in five rows (i.e., five reveals). In some embodiments, the plurality of solar cells 20 is arranged in six rows (i.e., six reveals). In some embodiments, the plurality of solar cells 20 is arranged in more than six rows.

In some embodiments, the fractional inactive area is calculated as (1) the sum of the first clearance distance C1 and the distances between the cell rows D (2) divided by a sum of the first clearance distance C1, the distances between the cell rows D, and the width W, when the plurality of solar cells 20 is arranged in a plurality of rows (i.e., reveals):

$$\text{Fractional inactive area} = (C1 + D1 + \ldots + D_n)/(C1 + D1 + \ldots + D_n + W)$$

wherein $D_n$ is the number of distances D between all the cell rows.

Figure 3:
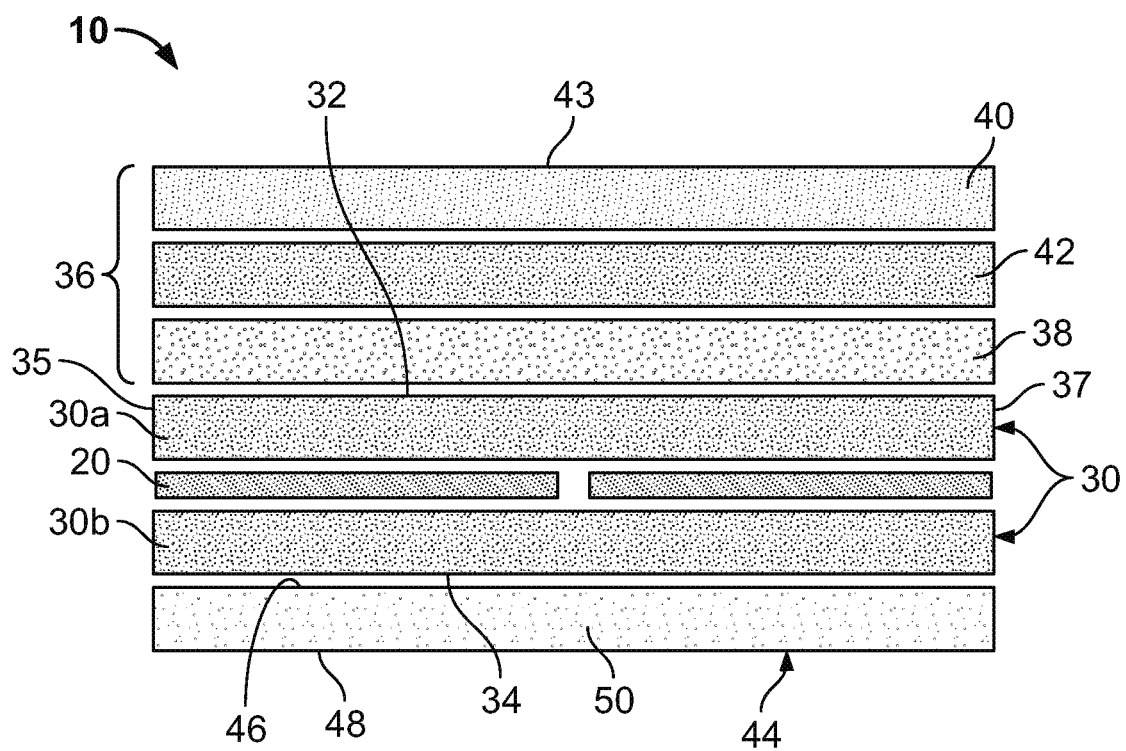
FIGS. 3 and 4 are schematic views of some embodiments of a photovoltaic module.
Figure 4:
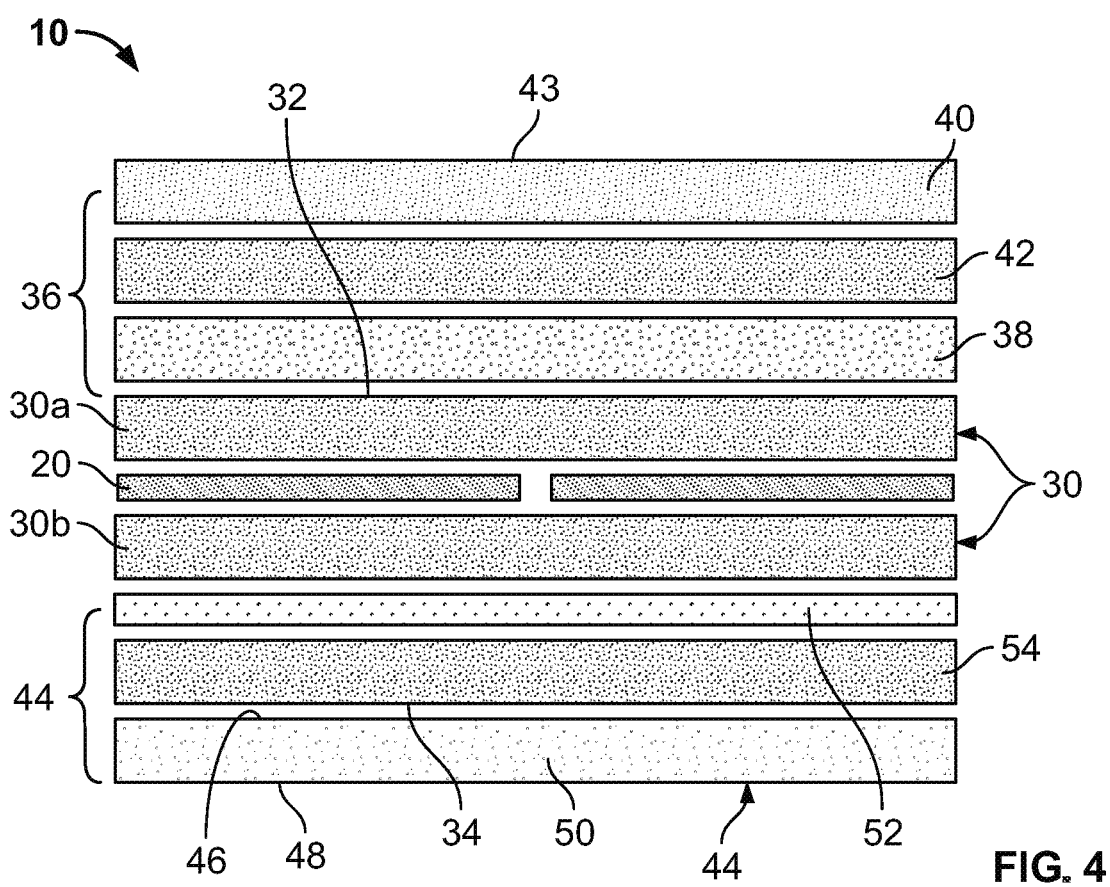

Referring to FIGS. 3 and 4, in some embodiments, the photovoltaic module 10 includes an encapsulant 30 encapsulating the at least one solar cell 20. In some embodiments, the encapsulant 30 includes a first layer 30a having a first surface 32 and a second layer 30b having a second surface 34 opposite the first surface 32. In some embodiments, the encapsulant 30 includes a first end 35 and a second end 37 opposite the first end 35. In some embodiments, the encapsulant 30 is transparent. In some embodiments, the first surface 32 extends from the first end 35 to the second end 37. In some embodiments, the encapsulant 30 extends from the first end 35 to the second end 37. In some embodiments, the photovoltaic module 10 includes a frontsheet 36 juxtaposed with the first surface 32 of the first layer 30a of the encapsulant 30. In some embodiments, the frontsheet 36 includes a glass layer 38. In some embodiments, the frontsheet 36 includes a polymer layer 40 attached to the glass layer 38. In some embodiments, the polymer layer 40 forms an upper surface of the photovoltaic module 10. In some embodiments, the polymer layer 40 is attached to the glass layer 38 by a first adhesive layer 42. In some embodiments, an upper surface 43 of the polymer layer 40 is an upper surface of the photovoltaic module 10. In some embodiments, the upper surface 43 of the polymer layer 40 is textured. In some embodiments, the upper surface 43 of the polymer layer 40 is embossed. In some embodiments, the upper surface 43 of the polymer layer 40 is embossed with a plurality of indentations. In some embodiments, the upper surface 43 of the polymer layer 40 includes a pattern. In some embodiments, the upper surface 43 of the polymer layer 40 includes a printed pattern. In some embodiments, the upper surface 43 of the polymer layer 40 includes an embossed pattern. In some embodiments, the upper surface 43 of the polymer layer 40 includes a textured pattern.

In some embodiments, the photovoltaic module 10 includes a backsheet 44. In some embodiments, the backsheet 44 is juxtaposed with the second surface 34 of the second layer 30b of the encapsulant 30. In some embodiments, the backsheet 44 includes a first surface 46 and a second surface 48 opposite the first surface 46 of the backsheet 44. In some embodiments, the second surface 48 of the backsheet 44 forms a lower surface of the photovoltaic module 10. In some embodiments, the backsheet 44 includes a first layer 50. In some embodiments, the backsheet 44 includes a second layer 52 (see FIG. 4). In some embodiments, the second layer 52 is attached to the first layer 50 by a second adhesive layer 54. In some embodiments, the backsheet 44 includes only one layer (see FIG. 3). In some embodiments, the backsheet 44 includes only the first layer 50 (see FIG. 3). In some embodiments, the backsheet 44 does not include the second layer 52 (see FIG. 3). In some embodiments, the backsheet 44 is composed of a polymer. In some embodiments, the backsheet 44 is composed of thermoplastic polyolefin (TPO). In some embodiments, the backsheet 44 forms the headlap portion 16.

In some embodiments, each of the encapsulant 30, the frontsheet 36, including each of the glass layer 38, the polymer layer 40, and the first adhesive layer 42, and the backsheet 44, including the first layer 50, the second layer 52, and the second adhesive layer 54 of the photovoltaic module 10, as applicable, includes a structure, composition and/or function of similar to those of more or one of the embodiments of the corresponding components disclosed in PCT International Patent Publication No. WO 2022/051593, Application No. PCT/US2021/049017, published Mar. 10, 2022, entitled Building Integrated Photovoltaic System, owned by GAF Energy LLC, the contents of which are incorporated by reference herein in its entirety.

In some embodiments, the photovoltaic module 10 includes a structure, composition, components, and/or function similar to those of one or more embodiments of the photovoltaic roofing shingles disclosed in U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023, the contents of each of which are incorporated by reference herein in its entirety.

Figure 5:
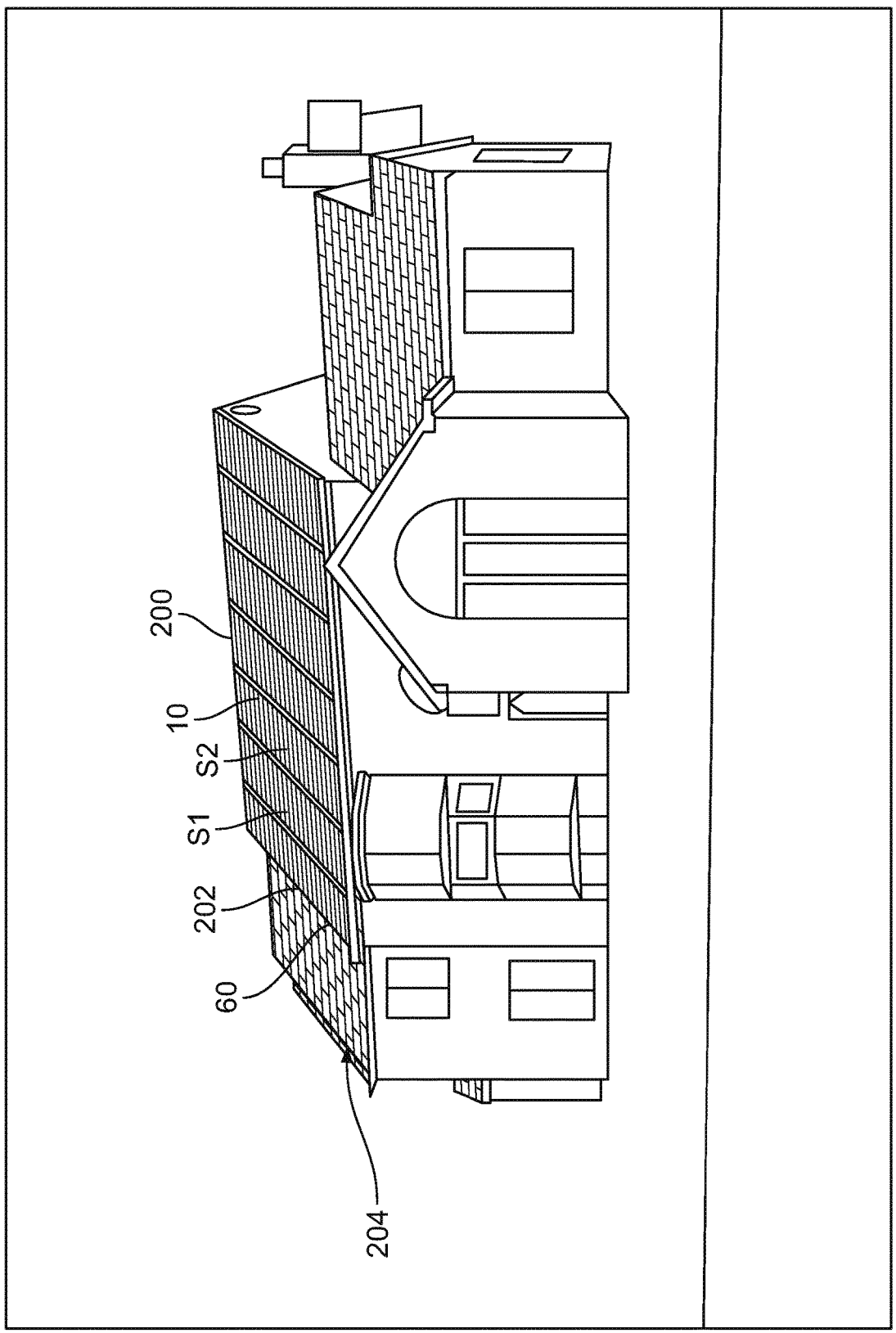
FIG. 5 illustrates some embodiments of a plurality of photovoltaic modules installed on a roof deck.

Referring to FIG. 5, in some embodiments, the photovoltaic module 10 is configured to be a component of a roofing system 200 installed on a roof deck 202 of a structure 204. In some embodiments, the structure 204 is a residential structure. In some embodiments, the structure 204 is a residential house. In some embodiments, the structure 204 is a commercial structure. In some embodiments, the photovoltaic modules 10 are arranged in an array on the roof deck 202. In some embodiments, the array of the photovoltaic modules 10 includes a plurality of subarrays. In some embodiments, the array includes at least two subarrays S1, S2. In some embodiments, the array includes more than two subarrays. In some embodiments, the array includes a single array. In some embodiments, each of the subarrays S1, S2 includes a plurality of rows of the photovoltaic modules 10.

In some embodiments, the first side lap 22 of one of the photovoltaic modules 10 in the subarray S2 overlays the second side lap 24 of an adjacent another one of the photovoltaic modules 10 in the subarray S1 in the same one of the rows. In some embodiments, the reveal portion 18 of one of the photovoltaic modules 10 in a subarray S1 overlays the headlap portion 16 of an adjacent another one of the photovoltaic modules 10 of the subarray S1. In some embodiments, the reveal portion 18 of one of the photovoltaic modules 10 in a subarray S2 overlays the headlap portion 16 of an adjacent another one of the photovoltaic modules 10 of the subarray S2.

Figure 6:
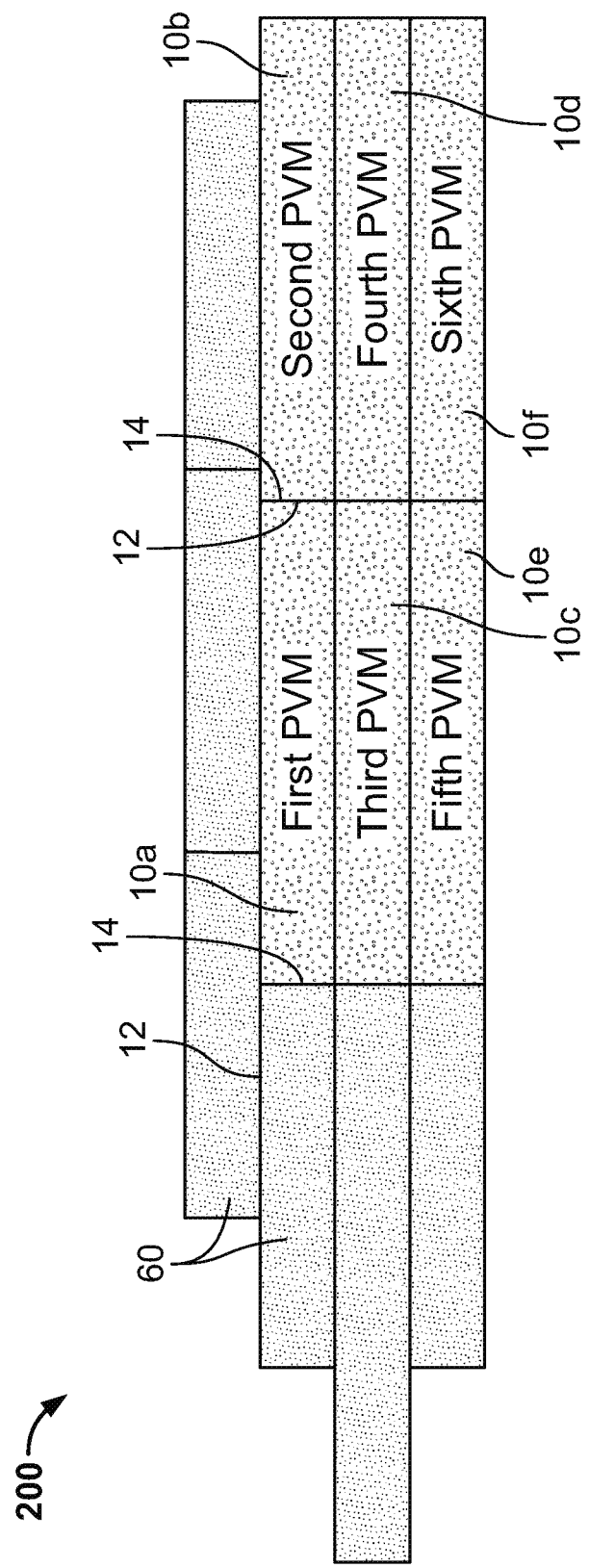
FIG. 6 is a schematic view of some embodiments of a plurality of photovoltaic modules and a plurality of roofing shingles of a roofing system installed on a rood deck.

Referring to FIG. 6, in some embodiments, a first photovoltaic module 10a of the plurality of photovoltaic modules 10 is horizontally adjacent to a second photovoltaic module 10b of the plurality of photovoltaic modules 10. In some embodiments, a third photovoltaic module 10c of the plurality of photovoltaic modules 10 is vertically adjacent to the first photovoltaic module 10a. In some embodiments, a fourth photovoltaic module 10d of the plurality of photovoltaic modules 10 is horizontally adjacent to the third photovoltaic module 10c of the plurality of photovoltaic modules 10. In some embodiments, the fourth photovoltaic module 10d is vertically adjacent to the second photovoltaic module 10b.

In some embodiments, the first ends 12 of the first photovoltaic module 10a and the third photovoltaic module 10c are aligned with each other. In some embodiments, the second ends 14 of the first photovoltaic module 10a and the third photovoltaic module 10c are aligned with each other. In some embodiments, the first ends 12 of the first photovoltaic module 10a and the third photovoltaic module 10c are substantially aligned with each other. In some embodiments, the second ends 14 of the first photovoltaic module 10a and the third photovoltaic module 10c are substantially aligned with each other.

In some embodiments, the first ends 12 of the second photovoltaic module 10b and the fourth photovoltaic module 10d are aligned with each other. In some embodiments, the second ends 14 of the second photovoltaic module 10b and the fourth photovoltaic module 10d are aligned with each other. In some embodiments, the first ends 12 of the second photovoltaic module 10b and the fourth photovoltaic module 10d are substantially aligned with each other. In some embodiments, the second ends 14 of the second photovoltaic module 10b and the fourth photovoltaic module 10d are substantially aligned with each other.

In some embodiments, the first photovoltaic module 10a overlays at least a part of the headlap portion 16 of the third photovoltaic module 10c. In some embodiments, the reveal portion 18 of the first photovoltaic module 10a overlays at least a part of the headlap portion 16 of the third photovoltaic module 10c. In some embodiments, the reveal portion 18 of the first photovoltaic module 10a overlays a substantial portion of the headlap portion 16 of the third photovoltaic module 10c. In some embodiments, the second photovoltaic module 10b overlays at least a part of the headlap portion 16 of the fourth photovoltaic module 10d. In some embodiments, the reveal portion 18 of the second photovoltaic module 10b overlays at least a part of the headlap portion 16 of the fourth photovoltaic module 10d. In some embodiments, the reveal portion 18 of the second photovoltaic module 10b overlays a substantial portion of the headlap portion 16 of the fourth photovoltaic module 10d.

In some embodiments, the second photovoltaic module 10b overlays at least a part of the first photovoltaic module 10a. In some embodiments, the second photovoltaic module 10b overlays at least a part of the second side lap 24 of the first photovoltaic module 10a. In some embodiments, the first side lap 22 of the second photovoltaic module 10b overlays at least a part of the second side lap 24 of the first photovoltaic module 10a. In some embodiments, the fourth photovoltaic module 10d overlays at least a part of the third photovoltaic module 10c. In some embodiments, the fourth photovoltaic module 10d overlays at least a part of the second side lap 24 of the third photovoltaic module 10c. In some embodiments, the first side lap 22 of the fourth photovoltaic module 10d overlays at least a part of the second side lap 24 of the third photovoltaic module 10c.

In some embodiments, the plurality of photovoltaic modules 10 includes a fifth photovoltaic module 10e. In some embodiments, the plurality of photovoltaic modules 10 includes a sixth photovoltaic module 10f. In some embodiments, the fifth photovoltaic module 10e and the sixth photovoltaic module 10f are installed on the roof deck 202 in an additional, lower row and in a similar manner as described above with respect to the photovoltaic modules 10a, 10b, 10c, 10d. In some embodiments, it is understood that more than the photovoltaic modules 10a, 10b, 10c, 10d, 10e, 10f may be installed in the columns and rows of the subarrays S1, S2 in a similar manner as described herein.

Still referring to FIG. 6, in some embodiments, a plurality of the roofing shingles 60 is installed on the roof deck 202. In some embodiments, the plurality of roofing shingles 60 is installed proximate to the plurality of photovoltaic modules 10. In some embodiments, the roofing shingles 60 are asphalt roofing shingles. In some embodiments, the roofing shingles 60 are non-asphaltic (NAS) roofing shingles. In some embodiments, one or more of the roofing shingles 60 includes a structure, composition, components, and/or function similar to those of one or more embodiments of the roofing shingles disclosed in U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023, the contents of each of which are incorporated by reference herein in its entirety.

In some embodiments, the roof deck 202 is a steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof.

Figure 7:
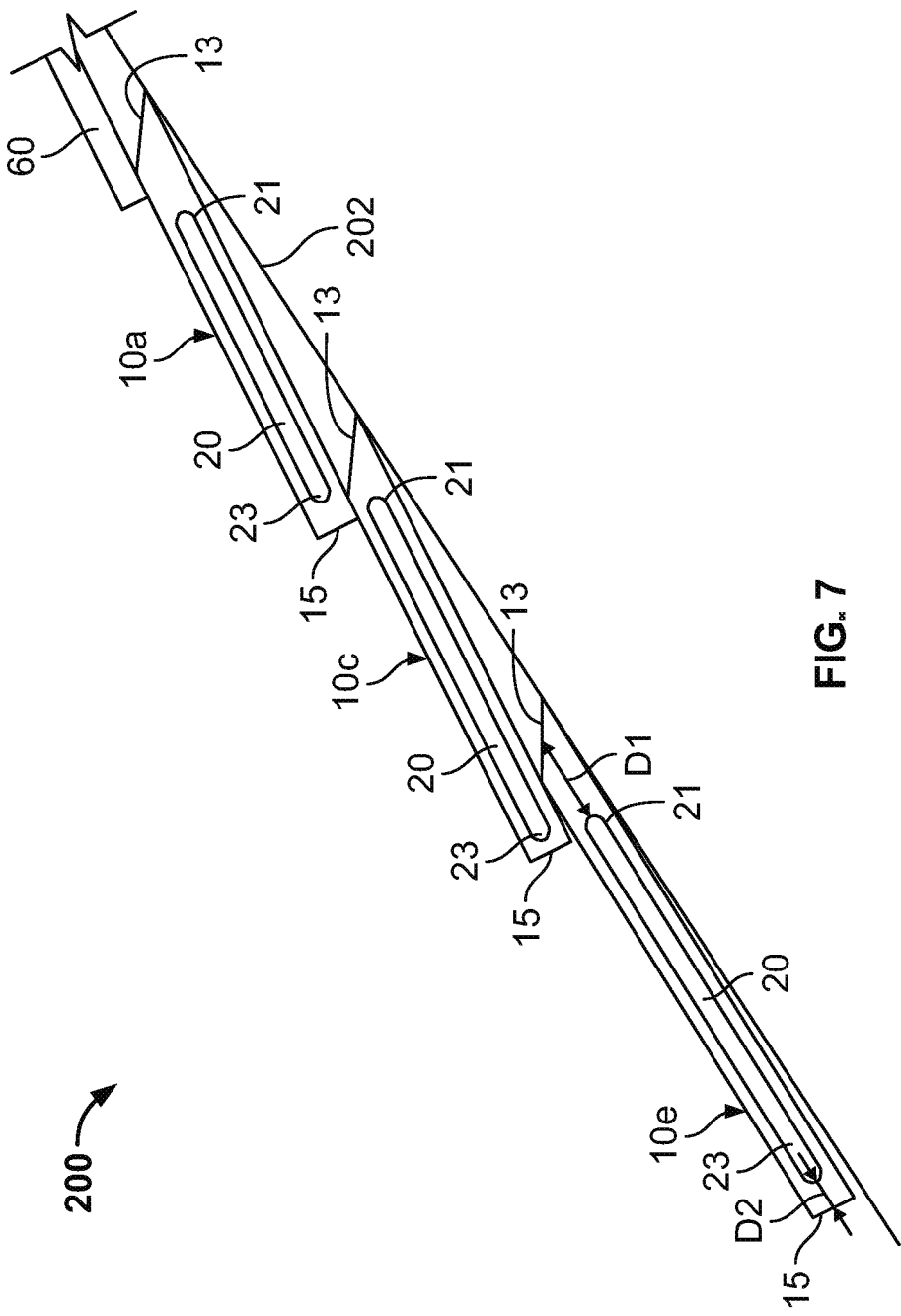
FIG. 7 is a schematic view of some embodiments of a plurality of photovoltaic modules installed on a roof deck.

Referring to FIG. 7, in some embodiments, the photovoltaic module 10a overlays at least a portion of the photovoltaic module 10c. In some embodiments, the lower edge 23 of the at least one solar cell 20 of the photovoltaic module 10a is aligned with the upper edge 21 of a corresponding one of the at least one solar cell 20 of the photovoltaic module 10c. In some embodiments, the lower edge 23 of the at least one solar cell 20 of the photovoltaic module 10a is substantially aligned with the upper edge 21 of a corresponding one of the at least one solar cell 20 of the photovoltaic module 10c.

In some embodiments, the photovoltaic module 10c overlays at least a portion of the photovoltaic module 10e. In some embodiments, the lower edge 23 of the at least one solar cell 20 of the photovoltaic module 10c is aligned with a corresponding one of the upper edge 21 of the at least one solar cell 20 of the photovoltaic module 10e. In some embodiments, the lower edge 23 of the at least one solar cell 20 of the photovoltaic module 10c is substantially aligned with a corresponding one of the upper edge 21 of the at least one solar cell 20 of the photovoltaic module 10e. In some embodiments, as used herein, the term "substantially aligned" means that the lower edge 23 of the solar cell 20 of an upper one of the photovoltaic modules 10 installed on the roof deck 202 is positioned at a distance above (e.g., is vertically offset from) the upper edge 21 of the solar cell 20 of another directly lower, overlapped one of the photovoltaic modules 10 installed on the roof deck 202 by no more than ten percent (10%) of the width W of the solar cell 20.

In some embodiments, the photovoltaic module 10b overlays at least a portion of the photovoltaic module 10d. In some embodiments, the lower edge 23 of the at least one solar cell 20 of the photovoltaic module 10b is aligned with the upper edge 21 of a corresponding one of the at least one solar cell 20 of the photovoltaic module 10d. In some embodiments, the lower edge 23 of the at least one solar cell 20 of the photovoltaic module 10b is substantially aligned with the upper edge 21 of a corresponding one of the at least one solar cell 20 of the photovoltaic module 10d. In some embodiments, the photovoltaic module 10d overlays at least a portion of the photovoltaic module 10f. In some embodiments, the lower edge 23 of the at least one solar cell 20 of the photovoltaic module 10d is aligned with a corresponding one of the upper edge 21 of the at least one solar cell 20 of the photovoltaic module 10d. In some embodiments, the lower edge 23 of the at least one solar cell 20 of the photovoltaic module 10d is substantially aligned with a corresponding one of the upper edge 21 of the at least one solar cell 20 of the photovoltaic module 10d.

In some embodiments, the roofing system 200 is configured to have an increased achievable energy density as compared to a roofing system 200 that does not include solar cells of photovoltaic modules that are aligned or substantially aligned as described above. In some embodiments, the overlap between the photovoltaic module 10a and the photovoltaic module 10c applies shade to all of the solar cells 20 of the photovoltaic module 10c uniformly to eliminate cell current mismatch in the module and minimize risk of bypass diode activation or hotspot formation. In some embodiments, the overlap between the photovoltaic module 10c and the photovoltaic module 10e applies shade to all of the solar cells 20 of the photovoltaic module 10e uniformly to eliminate cell current mismatch in the module and minimize risk of bypass diode activation or hotspot formation. In some embodiments, the foregoing applies to the overlap of the photovoltaic modules 10b, 10d, 10f.

In some embodiments, a total inactive fraction ($W_T$) of each of the photovoltaic modules 10 is calculated as the second clearance distance C2 divided by the sum of the second clearance distance C2 and the width W of the solar cell 20:

$$W_T = \frac{C2}{C2 + W}$$

EXAMPLE

In some embodiments, a photovoltaic module 10 including one row of the solar cells 20 has a clearance distance C2 of 15 mm and a cell width W of 182 mm has a total inactive fraction ($W_T$) of 0.076 or 7.6%.

In some embodiments, a method includes the steps of:
obtaining at least first, second and third ones of the photovoltaic modules 10;
installing the first photovoltaic module 10 on a roof deck 202;
installing the second photovoltaic module 10 on the roof deck 202 such that the second photovoltaic module 10 overlays at least a portion of the first photovoltaic module 10, the lower edge 23 of the at least one solar cell 20 of the second photovoltaic module 10 is substantially aligned with the upper edge 21 of the at least one solar cell 20 of the first photovoltaic module 10; and
installing the third photovoltaic module 10 on the roof deck 202, such that the third photovoltaic module 10 overlays at least a portion of the second photovoltaic module 10, and the lower edge 23 of the at least one solar cell 20 of the third photovoltaic module 10 is substantially aligned with the upper edge 21 of the at least one solar cell 20 of the second photovoltaic module 10.

In some embodiments, the photovoltaic module 10 includes a structure, composition, components, and/or function similar to those of one or more embodiments of the photovoltaic modules disclosed in U.S. Pat. No. 11,527,665 to Boitnott et al., issued Dec. 13, 2022 and entitled "Photovoltaic Module with Transparent Perimeter Edges," owned by GAF Energy LLC (the "665 Patent"), the contents of each of which are incorporated by reference herein in its entirety. It should be understood that reference numbers for the elements recited in the incorporated '665 Patent are not provided on certain elements described below so as not to overlap common reference numbers with other elements described above. With reference to the incorporated '665 Patent, in some embodiments, the backsheet includes a first section, and a second section juxtaposed with the first section. In some embodiments, the first section is transparent. In some embodiments, the second section is non-transparent. In some embodiments, the first end of the frontsheet, the first end of the encapsulant, and the first section of the backsheet form a transparent portion. In some embodiments, the transparent portion of the photovoltaic module overlays at least a portion of the at least one solar cell of the photovoltaic module. In some embodiments, the transparent portion of the second photovoltaic module overlays at least a portion of the at least one solar cell of the third photovoltaic module.

With continued reference to the incorporated '665 Patent, in some embodiments, the first section extends from the first edge of the photovoltaic module to a first location intermediate the first edge of the photovoltaic module and the second edge of the photovoltaic module. In some embodiments, the second section extends from the first location to the second edge of the photovoltaic module.

With continued reference to the incorporated '665 Patent, in some embodiments, the backsheet includes a first surface, a second surface opposite the first surface of the backsheet, a first side extending from the first edge of the photovoltaic module to the second edge of the photovoltaic module, and a second side opposite the first side and extending from the first edge to the second edge. In some embodiments, the first section extends from the first side to the second side and from the first surface of the backsheet to the second surface of the backsheet. In some embodiments, the second section extends from the first side to the second side and from the first surface of the backsheet to the second surface of the backsheet. In some embodiments, the photovoltaic module includes an adhesive juxtaposed with the first section of the backsheet. In some embodiments, the adhesive is transparent. In some embodiments, the adhesive optically couples the first photovoltaic module with the second photovoltaic module. In some embodiments, the adhesive optically couples the second photovoltaic module with the first photovoltaic module.

With continued reference to the incorporated '665 Patent, in some embodiments, the backsheet includes a first section. In some embodiments, the first section includes a beveled portion. In some embodiments, the beveled portion of the first photovoltaic module overlays at least a portion of the at least one solar cell of the second photovoltaic module. In some embodiments, the beveled portion of the second photovoltaic module overlays at least a portion of the at least one solar cell of the third photovoltaic module. In some embodiments, the beveled portion includes a reflective portion.

What is claimed is:

1. A system, comprising:
at least first, second and third photovoltaic modules installed on a sloped roof deck of a structure,
wherein each of the at least first, second and third photovoltaic modules includes
an upper edge and a lower edge opposite the upper edge, and
at least one solar cell
wherein the at least one solar cell includes
an upper edge, a lower edge opposite the upper edge of the at least one solar cell, and
a width extending from the upper edge of the at least one solar cell to the lower edge of the at least one solar cell,
wherein the upper edge of the at least one solar cell of the second photovoltaic module is offset from the upper edge of the second photovoltaic module by a first distance,
wherein the upper edge of the at least one solar cell of the third photovoltaic module is offset from the upper edge of the third photovoltaic module by the first distance,
wherein the lower edge of the at least one solar cell of the first photovoltaic module is offset from the lower edge of the first photovoltaic module by second distance,
wherein the lower edge of the at least one solar cell of the second photovoltaic module is offset from the lower edge of the second photovoltaic module by the second distance;
and
wherein the lower edge of the first photovoltaic module overlays at least a portion of the second photovoltaic module at the upper edge of the second photovoltaic module,
wherein the lower edge of the at least one solar cell of the first photovoltaic module is substantially aligned with the upper edge of a corresponding one of the at least one solar cell of the second photovoltaic module in a vertical direction,
wherein the lower edge of the second photovoltaic module overlays at least a portion of the third photovoltaic module at the upper edge of the third photovoltaic module, and
wherein the lower edge of the at least one solar cell of the second photovoltaic module is substantially aligned with a corresponding one of the upper edge of the at least one solar cell of the third photovoltaic module in the vertical direction.

2. The system of claim 1, wherein the lower edge of the at least one solar cell of the third photovoltaic module is offset from the lower edge of the third photovoltaic module by the second distance, and wherein the upper edge of the at least one solar cell of the first photovoltaic module is offset from the upper edge of the first photovoltaic module by the first distance.

3. The system of claim 1, wherein the at least one solar cell includes a plurality of solar cells, wherein the plurality of solar cells is arranged in a single row, wherein each of the at least first, second and third photovoltaic modules includes a fractional inactive area, and wherein the fractional inactive area is calculated as the first distance divided by a sum of the first distance and the width.

4. The system of claim 3, wherein the first distance is 0.1 mm to 25 mm.

5. The system of claim 4, wherein the width is 150 mm to 250 mm.

6. The system of claim 5, wherein the fractional inactive area is 0.05 to 0.1.

7. The system of claim 1, wherein the second distance is 0.1 mm to 25 mm.

8. The system of claim 1, wherein the at least one solar cell includes a plurality of solar cells, wherein the plurality of solar cells is arranged in a plurality of rows, wherein the lower edge of each of the plurality of solar cells in a lower most row of the plurality of rows of the first photovoltaic module is substantially aligned with the upper edge of a corresponding one of the plurality of solar cells in an upper most row of the plurality of rows of the second photovoltaic module, and wherein the lower edge of each of the plurality of solar cells in a lower most row of the plurality of rows of the second photovoltaic module is substantially aligned with the upper edge of a corresponding one of the plurality of solar cells in an upper most row of the plurality of rows of the third photovoltaic module.

9. The system of claim 1, wherein each of the at least first, second and third photovoltaic modules includes an encapsulant encapsulating the at least one solar cell, wherein the encapsulant includes a first end, a second end opposite the first end, a first surface extending from the first end to the second end, and a second surface opposite the first surface and extending from the first end to the second end, wherein the encapsulant is transparent.

10. The system of claim 9, wherein each of the at least first, second and third photovoltaic modules includes a frontsheet juxtaposed with the first surface of the encapsulant, wherein the frontsheet includes a first end and a second end opposite the first end of the frontsheet, and wherein the frontsheet is transparent.

11. The system of claim 10, wherein each of the at least first, second and third photovoltaic modules includes a backsheet juxtaposed with the second surface of the encapsulant, wherein at least a portion of the backsheet is transparent.

12. The system of claim 11, wherein the first section extends from the first edge of the corresponding one of the at least first, second and third photovoltaic modules to a first location intermediate the first edge of the corresponding one of the at least first, second and third photovoltaic modules and the second edge of the corresponding one of the at least first, second and third photovoltaic modules, and wherein the second section extends from the first location to the second edge of the corresponding one of the at least first, second and third photovoltaic modules.

13. The system of claim 12, wherein the backsheet includes a first surface, a second surface opposite the first surface of the backsheet, a first side extending from the first edge of the corresponding one of the at least first, second and third photovoltaic modules to the second edge the corresponding one of the at least first, second and third photovoltaic modules, and a second side opposite the first side and extending from the first edge of the corresponding one of the at least first, second and third photovoltaic modules to the second edge of the corresponding one of the at least first, second and third photovoltaic modules, wherein the first section extends from the first side to the second side and from the first surface of the backsheet to the second surface of the backsheet.

14. The system of claim 13, wherein the second section extends from the first side to the second side and from the first surface of the backsheet to the second surface of the backsheet.

15. The system of claim 1, wherein each of the at least first, second and third photovoltaic modules includes
a backsheet,
wherein the backsheet includes a first section,
wherein the first section includes a beveled portion, and
wherein the beveled portion of the first photovoltaic module overlays at least a portion of the at least one solar cell of the second photovoltaic module, and
wherein the beveled portion of the second photovoltaic module overlays at least a portion of the at least one solar cell of the third photovoltaic module.

16. The system of claim 15, wherein the beveled portion includes a reflective portion.

17. A method, comprising:
obtaining at least first, second and third photovoltaic modules,
wherein each of the at least first, second and third photovoltaic modules includes
an upper edge and a lower edge opposite the upper edge, and
at least one solar cell,
wherein the at least one solar cell includes an upper edge and a lower edge opposite the upper edge,
wherein the lower edge of the at least one solar cell is offset from the lower edge of a corresponding one of the at least first, second and third photovoltaic modules by a first distance,
wherein the upper edge of the at least one solar cell is offset from the upper edge of the corresponding one of the at least first, second and third photovoltaic modules by a second distance, and
installing the first photovoltaic module on a sloped roof deck of a structure;
installing the second photovoltaic module on the roof deck,
wherein the lower edge of the second photovoltaic module overlays at least a portion of the first photovoltaic module at the upper edge of the first photovoltaic module,
wherein the lower edge of the at least one solar cell of the second photovoltaic module is substantially aligned with the upper edge of the at least one solar cell of the first photovoltaic module in a vertical direction; and
installing the third photovoltaic module on the roof deck,
wherein the lower edge of the third photovoltaic module overlays at least a portion of the second photovoltaic module at the upper edge of the second photovoltaic module,
wherein the lower edge of the at least one solar cell of the third photovoltaic module is substantially aligned with the upper edge of the at least one solar cell of the second photovoltaic module in the first direction.

18. A system, comprising:
at least first, second and third photovoltaic modules installed on a sloped roof deck of a structure,
wherein each of the at least first, second and third photovoltaic modules includes
an upper edge and a lower edge opposite the upper edge, and
at least one solar cell
wherein the at least one solar cell includes
an upper edge, a lower edge opposite the upper edge of the at least one solar cell, and
a width extending from the upper edge of the at least one solar cell to the lower edge of the at least one solar cell,
wherein the upper edge of the at least one solar cell of the second photovoltaic module is offset from the upper edge of the second photovoltaic module by a first distance,
wherein the upper edge of the at least one solar cell of the third photovoltaic module is offset from the upper edge of the third photovoltaic module by the first distance,
wherein the lower edge of the at least one solar cell of the first photovoltaic module is offset from the lower edge of the first photovoltaic module by a second distance,
wherein the lower edge of the at least one solar cell of the second photovoltaic module is offset from the lower edge of the second photovoltaic module by the second distance;
an encapsulant encapsulating the at least one solar cell,
wherein the encapsulant includes a first end, a second end opposite the first end, a first surface extending from the first end to the second end, and a second surface opposite the first surface and extending from the first end to the second end,
wherein the encapsulant is transparent;
a frontsheet juxtaposed with the first surface of the encapsulant,
wherein the frontsheet includes a first end and a second end opposite the first end of the frontsheet, and wherein the frontsheet is transparent; and
a backsheet juxtaposed with the second surface of the encapsulant,
wherein the backsheet includes
a first section, and
a second section juxtaposed with the first section,
wherein the first section is transparent,
wherein the second section is non-transparent,
wherein the first end of the frontsheet, the first end of the encapsulant, and the first section of the backsheet form a transparent portion,
wherein the transparent portion of the first photovoltaic module overlays at least a portion of the at least one solar cell of the second photovoltaic module, and
wherein the transparent portion of the second photovoltaic module overlays at least a portion of the at least one solar cell of the third photovoltaic module,
wherein the lower edge of the first photovoltaic module overlays at least a portion of the second photovoltaic module at the upper edge of the second photovoltaic module,
wherein the lower edge of the at least one solar cell of the first photovoltaic module is substantially aligned with the upper edge of a corresponding one of the at least one solar cell of the second photovoltaic module in a vertical direction,
wherein the lower edge of the second photovoltaic module overlays at least a portion of the third photovoltaic module at the upper edge of the third photovoltaic module, and wherein the lower edge of the at least one solar cell of the second photovoltaic module is substantially aligned with a corresponding one of the upper edge of the at least one solar cell of the third photovoltaic module in the vertical direction.

* * * * *